(12) United States Patent
Park

(10) Patent No.: US 7,217,633 B2
(45) Date of Patent: May 15, 2007

(54) METHODS FOR FABRICATING AN STI FILM OF A SEMICONDUCTOR DEVICE

(75) Inventor: Geon-Ook Park, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 249 days.

(21) Appl. No.: 11/027,519

(22) Filed: Dec. 30, 2004

(65) Prior Publication Data

US 2005/0142805 A1    Jun. 30, 2005

(30) Foreign Application Priority Data

Dec. 31, 2003    (KR) ...................... 10-2003-0101918

(51) Int. Cl.
*H01L 21/76* (2006.01)
(52) U.S. Cl. ................. 438/429; 257/E21.438
(58) Field of Classification Search ................ 438/424, 438/429; 257/E21.438
See application file for complete search history.

(56) References Cited

U.S. PATENT DOCUMENTS

| 6,436,791 B1 * | 8/2002 | Lin et al. ..................... 438/424 |
| 6,444,518 B2 * | 9/2002 | Jang et al. .................. 438/245 |
| 6,723,618 B2 * | 4/2004 | Meyer et al. ................ 438/429 |

\* cited by examiner

*Primary Examiner*—Bradley K. Smith
(74) *Attorney, Agent, or Firm*—Andrew D. Fortney

(57) ABSTRACT

Methods for fabricating a shallow trench isolation (STI) of a semiconductor device are disclosed. A disclosed method includes: forming a trench on a semiconductor substrate, forming an oxide layer on the semiconductor substrate and the trench, forming a photoresist pattern on the oxide layer exposing the oxide layer on a bottom surface of the trench, forming STI films on sidewalls of the trench by etching the exposed oxide layer using the photoresist pattern as an etch protection layer, removing the photoresist pattern, developing an epitaxial layer between the STI, and planarizing the epitaxial layer and the oxide layer.

12 Claims, 3 Drawing Sheets

METHODS FOR FABRICATING AN STI FILM OF A SEMICONDUCTOR DEVICE

FIELD OF THE DISCLOSURE

The present disclosure relates generally to semiconductor fabrication and, more particularly, to methods for fabricating a shallow trench isolation (STI) film of a semiconductor device.

BACKGROUND

Typically, a trench of a semiconductor device is formed by sequentially depositing a pad oxide layer ($SiO_2$) and a nitride layer ($SiN_x$) on a silicon substrate. The pad oxide layer and the nitride layer are patterned to expose the silicon substrate. Then, the exposed silicon substrate is etched to a predetermined depth using the patterned nitride layer as an etch protection layer to thereby form a trench pattern in the silicon substrate.

Subsequently, a thermal oxide layer is formed inside the trench pattern via a thermal oxidation process. Another oxide layer is deposited over the thermal oxide layer within the shallow trench. The oxide layer is thermally treated to form a shallow trench isolation (STI) structure within the trench pattern. The STI formed on the semiconductor substrate is planarized through a chemical mechanical polishing process (CMP) to complete the STI film.

However, the conventional STI fabrication method has drawbacks. For example, it is difficult to reduce the linewidth of the STI film. Further, scratches and particles may occur during the CMP process.

Figure 1:
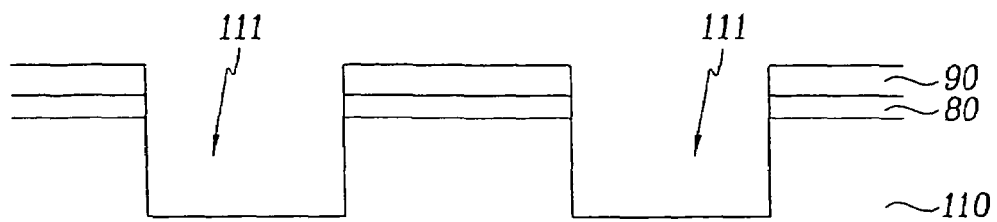
FIG. 1 to FIG. 7 are cross-sectional views illustrating an example process for fabricating an STI film of a semiconductor device in accordance with the teachings of the present invention.

To clarify multiple layers and regions, the thickness of the layers are enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

An example method for fabricating a STI film of a semiconductor device will now be described. FIG. 1 to FIG. 7 are cross-sectional views illustrating an example fabrication process. Referring to FIG. 1, a pad oxide layer 80 and a pad nitride layer 90 are sequentially formed on a semiconductor substrate 110, (e.g., a silicon substrate). The pad oxide layer 80 and the pad nitride layer 90 are etched so as to partially expose field regions in which the semiconductor device is to be formed. The semiconductor substrate 110 is then etched to a predetermined depth using the patterned pad nitride layer 90 as an etch protection mask to form trenches 111. Thus, the width of each exposed field region corresponds to the width of the trench 111.

Figure 2:
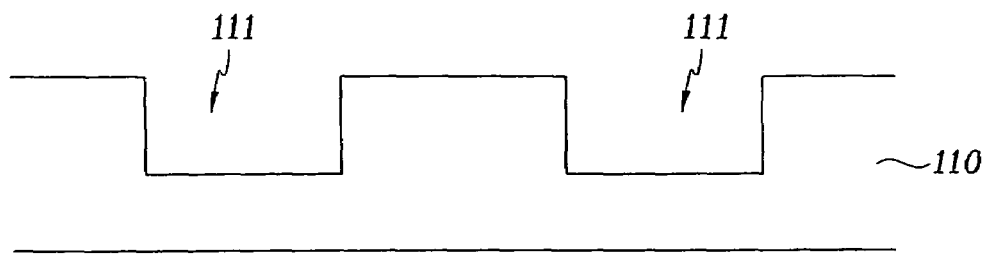

Referring to FIG. 2, the patterned pad nitride layer 80 and the pad oxide layer 90 are removed to complete the trenches 111. The STI film 125 is formed on both sidewalls of the trench 111 in the following process.

Figure 3:
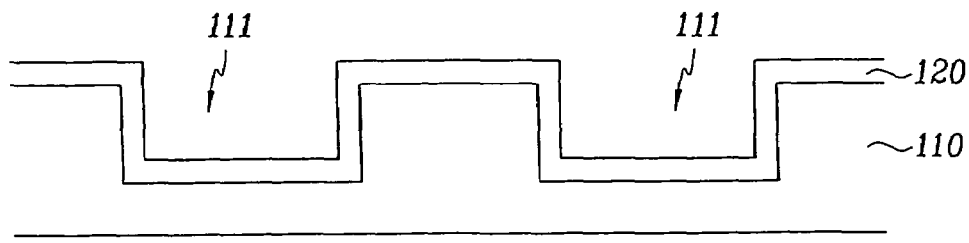

Referring to FIG. 3, a thermal oxide layer 120 is developed on the entire surface of the semiconductor substrate 110 through a thermal oxidation process. The thermal oxide layer 120 is formed over the semiconductor substrate and on the side and bottom walls of the trench 111. The thickness of the thermal oxide layer 120 is the linewidth of the STI film.

Figure 4:
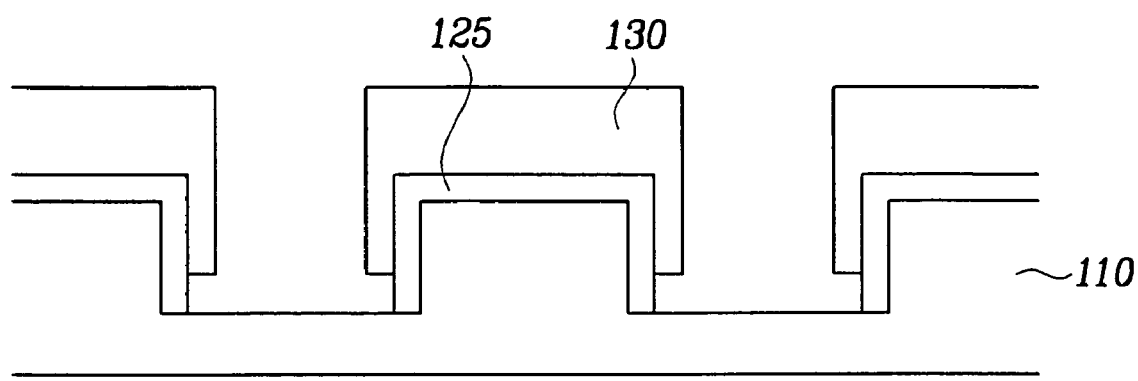

Referring to FIG. 4, a photoresist pattern 130 is formed by coating, exposing, and developing a photoresist layer on the thermal oxide layer 120. The photoresist pattern 130 defines openings above the trenches 111. The openings of the photoresist pattern 130 have a narrower width than the trenches 111. The openings of the photoresist pattern 130 expose the thermal oxide layer at the bottoms of the trenches 111.

In the illustrated example, the photoresist pattern 130 is formed thicker than the thermal oxide layer 120. As mentioned above, the openings of the photoresist pattern 130 are narrower than the widths of their corresponding trenches 111. Thus, the photoresist pattern 130 covers the thermal oxide layer 120 formed on the sidewalls of the trenches 111 and exposes the thermal oxide layer 120 at the bottoms of the trenches 111.

The thermal oxide layer 120 is etched using the photoresist pattern 130 as an etch protection layer such that the exposed portions of the thermal oxide layer 120 are removed and the bottom surfaces of the trenches 111 are exposed.

During an initial period of the etching process of the thermal oxide layer 120, the straightness of the etchant is strong such that the thermal oxide layer 120 formed on the bottom surface of the trenches 111 is removed to exposed the silicon substrate. After the silicon substrate is exposed, the thermal oxide layer 120 is partially removed at both end parts of the photoresist pattern 130 using the isotropic affect of the etchant to prevent the thermal oxide layer 120 from blocking development of an epitaxial layer 113 in the following process.

Accordingly, the thermal oxide layer 120 remains on both sidewalls in a vertical orientation. The thermal oxide layers on the sidewalls become the STI film 125.

After the etching process, the photoresist is removed and the resulting structure is cleaned.

Figure 5:
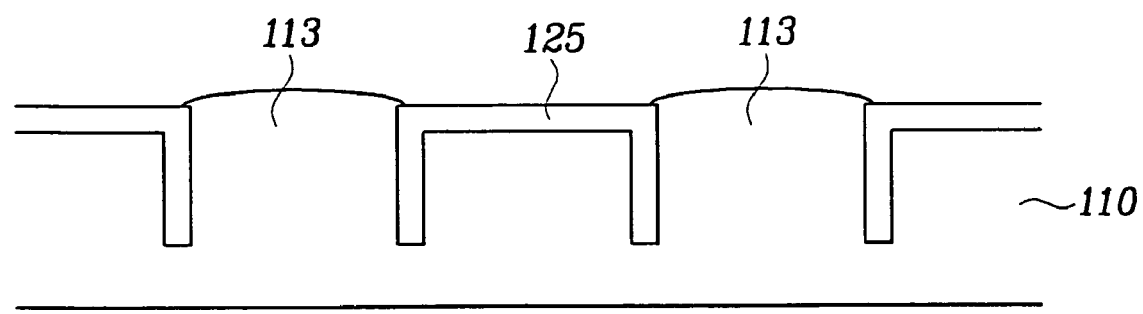

Referring to FIG. 5, an epitaxial layer 113 is developed on the portions of the silicon substrate 110 which are exposed at the bottom surfaces of the trenches 111. The epitaxial layer 113 fills the trenches 111 as shown in FIG. 5.

Figure 6:
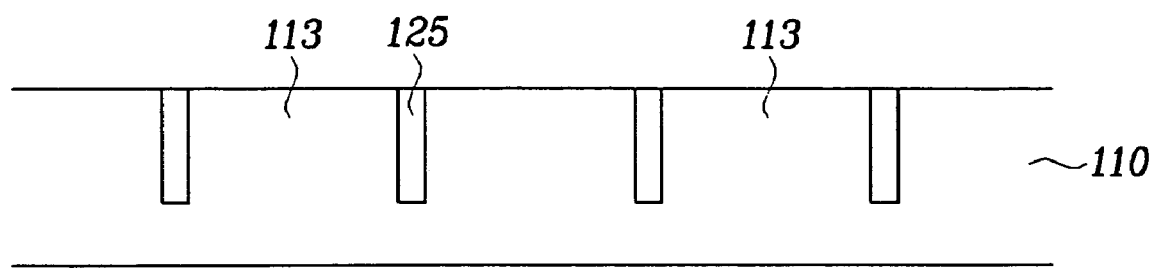

Referring to FIG. 6, the silicon substrate 110, the epitaxial layer 113, and the remaining thermal oxide layer 125 are simultaneously planarized through a chemical mechanical polishing process (CMP). The STI film formation is completed by sequentially cleaning and thermal-treating the resulting structure at a temperature over 1000° C. That is, the thermal oxide layer 125 remaining on the sidewalls of the trenches 111 become STI films 125, and the thickness of the thermal oxide layer 120 becomes the linewidth of the STI film 125.

Figure 7:
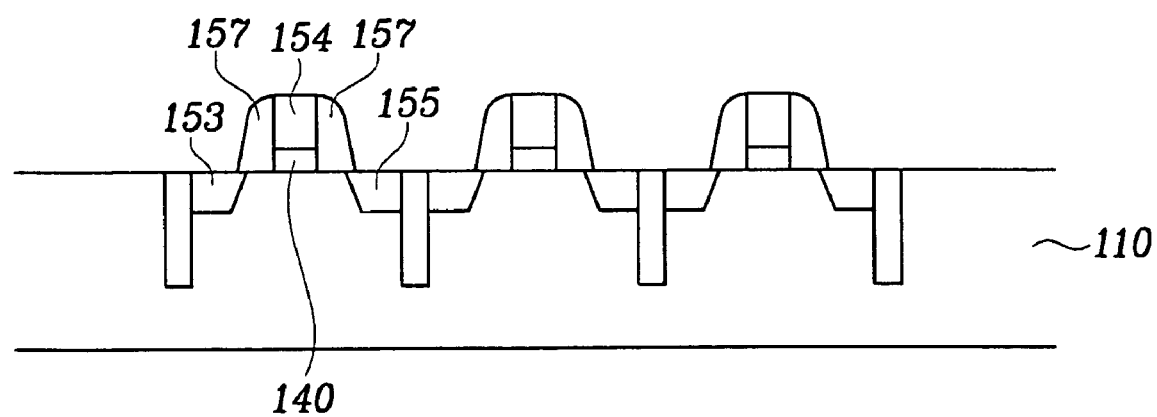

Referring to FIG. 7, gate dielectric layers 140 and gate electrodes 154 are formed between the STI films 125. Sidewall spacers 157 of nitride are formed on the sidewalls of the gate electrodes 154 and the gate dielectric layer 140.

Subsequently, low or a high concentration impurities are implanted within the semiconductor substrate 110 through an ion implantation process using the gate electrodes 154 as the ion injection mask so as to form source and drain regions 153 and 155 of the MOS transistors.

As described above, the STI 125 has a narrow linewidth corresponding to the thickness of the thermal oxide layer 120. As a result, it is possible to increase the integrity of the semiconductor device. Also, in the above described STI fabrication process, it is possible to prevent the occurrence of voids and seams, which occur in a conventional STI fabrication methods. Further, since the above-described STI film is formed using the thermal oxide layer 125, it is possible to have a high breakdown voltage and improve the yield of the fabrication process.

From the foregoing, persons of ordinary skill in the art will readily appreciate that a disclosed method for fabricating an STI film of a semiconductor device includes: forming a trench on a semiconductor substrate, forming an oxide layer on the semiconductor substrate and the trench, forming a photoresist pattern on the oxide layer exposing the oxide layer on a bottom surface of the trench, forming an STI film on sidewalls of the trench by etching the exposed oxide layer using the photoresist pattern as an etch protection layer, removing the photoresist pattern, developing an epitaxial layer between the STI films formed on the sidewalls of the trench, and planarizing the epitaxial layer and the oxide layer on the semiconductor substrate.

Preferably, the oxide layer is a thermal oxide layer.

Preferably, the trench is a region in which a semiconductor device is formed.

Preferably, a thickness of the oxide layer is a linewidth of the STI film.

Preferably, a width of the photoresist pattern is narrower than a width of the trench.

Preferably, the photoresist pattern covers the oxide layer formed on the sidewalls of the trench and exposes the oxide layer formed on the bottom of the trench.

Preferably, a width of the trench is more than 4 times of a thickness of the oxide layer.

Preferably, the semiconductor substrate is exposed by applying an etchant having a strong anisotropic characteristic during an initial period and having a strong isotropic affect after the semiconductor substrate has been exposed.

Preferably, the trench is filled by an epitaxial layer developed on a bottom surface of the trench.

Preferably, the epitaxial layer and the oxide layer are simultaneously planarized through a chemical mechanical polishing process.

Preferably, the semiconductor structure is thermally treated at a temperature over 1000° C. after the epitaxial layer and the oxide layer are planarized.

Persons of ordinary skill in the art will further appreciate that a disclosed method for fabricating a semiconductor device includes: forming a trench in a semiconductor substrate, forming an oxide layer on the semiconductor substrate and the trench, forming a photoresist pattern on the oxide layer to expose the oxide layer on a bottom surface of the trench, forming STI films on sidewalls of the trench by etching the exposed oxide layer using the photoresist pattern as an etch protection layer, removing the photoresist pattern, developing an epitaxial layer between the STI films formed on the sidewalls of the trench, planarizing the epitaxial layer and the oxide layer, and forming a MOS transistor having a gate dielectric layer, a gate electrode, and source and drain regions between the STI films of the semiconductor substrate.

It is noted that this patent claims priority from Korean Patent Application Serial Number 10-2003-0101918, which was filed on Dec. 31, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for fabricating an STI of a semiconductor device, comprising:
   forming a trench in a semiconductor substrate;
   forming an oxide layer on the semiconductor substrate and the trench;
   forming a photoresist pattern on the oxide layer to expose the oxide layer on a bottom surface of the trench;
   forming STI films on sidewalls of the trench by etching the exposed oxide layer using the photoresist pattern as an etch protection layer;
   removing the photoresist pattern;
   developing an epitaxial layer between the STI films; and
   planarizing the epitaxial layer and the oxide layer.

2. A method as defined in claim 1, wherein the oxide layer is a thermal oxide layer.

3. A method as defined in claim 1, wherein the trench is located at a region in which a semiconductor device is to be formed.

4. A method as defined in claim 1, wherein a thickness of the oxide layer corresponds to a linewidth of the STI film.

5. A method as defined in claim 1, wherein a width of an opening defined by the photoresist pattern and exposing the oxide layer is narrower than a width of an opening of the trench.

6. A method as defined in claim 5, wherein the photoresist pattern covers the oxide layer formed on the sidewalls of the trench and exposes the oxide layer formed on the bottom wall of the trench.

7. A method as defined in claim 6, wherein a width of the trench is four or more times greater than a thickness of the oxide layer.

8. A method as defined in claim 1, wherein etching the exposed oxide comprises anisotropically etching during an initial period and isotropically etching after the semiconductor substrate has been exposed.

9. A method as defined in claim 1, wherein the trench is filled by the epitaxial layer.

10. A method as defined in claim 1, wherein planarizing the epitaxial layer and the oxide layer comprises simultaneously chemical mechanical polishing the epitaxial layer and the oxide layer.

11. A method as defined in claim 1, further comprising thermal-treating at a temperature over 1000° C. after the epitaxial layer and the oxide layer are planarized.

12. A method for fabricating a semiconductor device, comprising:
   forming a trench on a semiconductor substrate;
   forming an oxide layer on the semiconductor substrate and the trench;
   forming a photoresist pattern on the oxide layer, the photoresist pattern exposing the oxide layer on a bottom surface of the trench
   forming STI films on sidewalls of the trench by etching the exposed oxide layer using the photoresist pattern as an etch protection layer;
   removing the photoresist pattern;
   developing an epitaxial layer between the STI films;
   planarizing the epitaxial layer and the oxide layer; and
   forming a MOS transistor having a gate dielectric layer, a gate electrode, and source and drain regions between the STI films of the semiconductor substrate.

* * * * *